(12) United States Patent
Kerwin et al.

(10) Patent No.: US 9,378,955 B2
(45) Date of Patent: *Jun. 28, 2016

(54) WAFER STRUCTURE FOR ELECTRONIC INTEGRATED CIRCUIT MANUFACTURING

(75) Inventors: David B. Kerwin, Colorado Springs, CO (US); Joseph M. Benedetto, Monument, CO (US)

(73) Assignee: Aeroflex Colorado Springs Inc., Colorado Springs, CO (US)

(*) Notice: Subject to any disclaimer, the term of this patent is extended or adjusted under 35 U.S.C. 154(b) by 39 days.

This patent is subject to a terminal disclaimer.

(21) Appl. No.: 13/218,273

(22) Filed: Aug. 25, 2011

(65) Prior Publication Data

US 2013/0049173 A1    Feb. 28, 2013

(51) Int. Cl.
| | | |
|---|---|---|
| H01L 21/02 | (2006.01) | |
| H01L 21/20 | (2006.01) | |
| H01L 21/18 | (2006.01) | |
| H01L 29/66 | (2006.01) | |
| H01L 29/868 | (2006.01) | |
| H01L 27/092 | (2006.01) | |
| H01L 21/263 | (2006.01) | |
| H01L 29/78 | (2006.01) | |

(52) U.S. Cl.
CPC ............ *H01L 21/187* (2013.01); *H01L 21/263* (2013.01); *H01L 27/0921* (2013.01); *H01L 29/66136* (2013.01); *H01L 29/78* (2013.01); *H01L 29/868* (2013.01)

(58) Field of Classification Search
CPC ..... H01L 21/36; H01L 21/425; H01L 21/265; H01L 21/22; H01L 21/04
USPC .......... 438/478, 479, 516, 528, 549, 510, 520
See application file for complete search history.

(56) References Cited

U.S. PATENT DOCUMENTS

| | | | |
|---|---|---|---|
| 4,935,386 A | 6/1990 | Nakagawa et al. | |
| 5,541,122 A | 7/1996 | Tu et al. | |
| 5,648,288 A | 7/1997 | Williams et al. | |
| 6,027,956 A | 2/2000 | Irissou | |
| 6,274,892 B1 | 8/2001 | Kub et al. | |
| 6,346,460 B1 * | 2/2002 | Kononchuk et al. | 438/473 |

(Continued)

FOREIGN PATENT DOCUMENTS

| | | |
|---|---|---|
| EP | 0327316 A2 | 8/1989 |
| EP | 0889509 A2 | 1/1999 |

(Continued)

OTHER PUBLICATIONS

PCT/US2012/052264, International Search Report and Written Opinion dated Jun. 18, 2013, 14 pgs.

(Continued)

*Primary Examiner* — Julio J Maldonado
*Assistant Examiner* — Moin Rahman
(74) *Attorney, Agent, or Firm* — Peter J. Meza; Hogan Lovells US LLP

(57) ABSTRACT

A bonded wafer structure having a handle wafer, a device wafer, and an interface region with an abrupt transition between the conductivity profile of the device wafer and the handle wafer is used for making semiconductor devices. The improved doping profile of the bonded wafer structure is well suited for use in the manufacture of integrated circuits. The bonded wafer structure is especially suited for making radiation-hardened integrated circuits.

21 Claims, 7 Drawing Sheets

(56) References Cited

U.S. PATENT DOCUMENTS

| | | | |
|---|---|---|---|
| 7,285,475 | B2 | 10/2007 | Czagas et al. |
| 7,667,329 | B2 | 2/2010 | Rogge |
| 7,978,804 | B2 | 7/2011 | Groves et al. |
| 2002/0063303 | A1* | 5/2002 | Pauchard et al. ............. 257/461 |
| 2003/0140317 | A1 | 7/2003 | Brewer et al. |
| 2003/0162355 | A1* | 8/2003 | Sankin et al. ................. 438/268 |
| 2006/0154442 | A1 | 7/2006 | de Souza et al. |
| 2007/0063217 | A1* | 3/2007 | Brogan et al. ................ 257/133 |
| 2007/0141794 | A1 | 6/2007 | Morris |
| 2007/0148422 | A1 | 6/2007 | Schulze et al. |
| 2007/0181978 | A1 | 8/2007 | Gardner |
| 2009/0185316 | A1 | 7/2009 | Schneider et al. |
| 2009/0253245 | A1* | 10/2009 | Park ................... H01L 21/2007 438/455 |
| 2009/0305454 | A1* | 12/2009 | Cohen ............................ 438/73 |
| 2009/0309190 | A1 | 12/2009 | Nevin et al. |
| 2010/0224891 | A1* | 9/2010 | Zhang et al. .................... 257/94 |
| 2011/0012200 | A1 | 1/2011 | Allibert et al. |
| 2011/0042576 | A1 | 2/2011 | Wilson et al. |
| 2011/0193134 | A1 | 8/2011 | Passlack |
| 2012/0032229 | A1* | 2/2012 | Deai et al. ..................... 257/190 |

FOREIGN PATENT DOCUMENTS

| | | |
|---|---|---|
| KR | 1020080032199 | 4/2008 |
| WO | 9209099 A1 | 5/1992 |

OTHER PUBLICATIONS

Partial European Search Report for Application No. 12826508.9 dated Feb. 6, 2015, 7 pgs.
PCT International Search report, application No. PCT/US2012/052293, mailing date Jan. 31, 2013, pp. 3.
PCT International Search report, application No. PCT/US2012/052299, mailing date Jan. 31, 2013, pp. 3.
PCT International Search report, application No. PCT/US2012/052302, mailing date Jan. 31, 2013, pp. 3.
Barnaby, H.J.; Total-Ionizing-Dose Effects in Modern CMOS Technologies, IEEE Transactions on Nuclear Science, vol. 53, No. 6, Dec. 2006, pp. 3103-3121.
PCT Written Opinion, application No. PCT/US2012/052280, mailing date Jan. 30, 2013, pp. 6.
PCT Written Opinion, application No. PCT/US2012/052269, mailing date Jan. 31, 2013, pp. 6.
PCT Written Opinion, application No. PCT/US2012/052293, mailing date Jan. 31, 2013, pp. 6.
PCT Written Opinion, application No. PCT/US2012/052299, mailing date Jan. 31, 2013, pp. 6.
PCT Written Opinion, application No. PCT/US2012/052302, mailing date Jan. 31, 2013, pp. 3.
PCT International Search report, application No. PCT/US2012/052280, mailing date Jan. 30, 2013, pp. 3.
PCT International Search report, application No. PCT/US2012/052269, mailing date Jan. 31, 2013, pp. 3.

* cited by examiner

WAFER STRUCTURE FOR ELECTRONIC INTEGRATED CIRCUIT MANUFACTURING

RELATED CASE INFORMATION

This application is related to:
application Ser. No. 13/218,308;
application Ser. No. 13/218,335;
application Ser. No. 13/218,345;
application Ser. No. 13/218,352; and
application Ser. No. 13/218,292,
all of which are entitled "WAFER STRUCTURE FOR ELECTRONIC INTEGRATED CIRCUIT MANUFACTURING", all of which are herein incorporated by reference as if set forth in their entireties, and all of which are filed concurrently.

FIELD OF THE INVENTION

The present invention relates to wafer structures used for the manufacture of electronic integrated circuits, and more particularly to semiconductor integrated circuits, including complementary metal-oxide-silicon (CMOS) integrated circuits.

BACKGROUND OF THE INVENTION

It is well known that ionizing radiation (such as gamma rays, x-rays, electrons, and protons) cause degradation of electronic integrated circuits, especially semiconductor integrated circuits. Several different radiation effects have been observed since the 1970's, and have been studied for several decades following the first observations. One effect of ionizing radiation on metal oxide semiconductor (MOS) integrated circuits is a cumulative degradation of the circuit due to trapping of radiation induced charges in the dielectric layers and gate regions and at the silicon silicon-dioxide interface of MOS devices. The deleterious effects include an increase in leakage currents and threshold voltage shifts due to the trapped holes (and/or interface traps, border traps, or other similar trapped charge states). A review of such total ionizing dose (TID) effects has been provided by Barnaby (H. J. Barnaby, "Total-Ionizing-Dose Effects in Modern CMOS Technologies", *IEEE Transactions on Nuclear Science Volume 56 Number 6*, pp 3103-3121, 2006).

Another class of ionizing radiation damage is called single event effects (SEE's). Single event effects result from a transient deposition of charge in the integrated circuit due to a single heavy ion, a single proton, or other single particle. An SEE may cause an upset in the value of a memory bit, a transient analog signal, an electrical latch-up, a gate dielectric rupture, or many other events. Some such SEE's cause irreversible damage to the integrated circuit, such as in single event latch-up (SEL). Other SEE events only cause loss of data, and may be recovered by re-writing the effected memory location with the correct data, as in single event upset (SEU).

Process independent approaches utilizing device and circuit design techniques have also been utilized, but these methods resulted in inferior electrical performance and increased circuit size. All of these hardening approaches are well known in the art and have proved very effective in mitigating and/or preventing total ionizing dose changes in MOS integrated circuits specifically designed or re-designed for use in radiation environments. What is desired, therefore, is an integrated circuit wafer structure and corresponding method that is radiation hardened, yet maintains good electrical performance without the penalty of increased circuit size.

SUMMARY OF THE INVENTION

According to embodiments of the present invention, a family of engineered wafer structures is compatible for use as substrates for manufacturing existing commercial electronic integrated circuits (IC's).

According to embodiments of the present invention, hardening of such existing IC's against both total ionizing dose (TID) radiation effects (including, neutrons and the secondary particles generated by the neutrons) and single event effects (SEE) is made possible by both pinning the surface potential of the potentially affected regions in the integrated circuit, and by limiting the generation of electron hole pairs produced in sensitive regions of the integrated circuit due to bombardment of the IC with heavy ions, gamma rays, x-rays, electrons, protons, or other types of ionizing radiation as is described herein.

Further, the embodiments of the present invention can be combined in such a way as to provide both an improved substrate to manufacture existing circuits, or to provide hardening of newly designed circuits either alone or in combination with existing designs. Embodiments of the present invention also provide improved hardening of fully completed integrated circuits via high energy monoenergetic neutron bombardment. Monoenergetic neutron bombardment allows for creation of the defects to reduce the minority carrier lifetime in the base regions of the parasitic SCR structures inherent in modern CMOS IC's. Previous work on neutron bombardment of existing ICs proved largely ineffective due to the concomitant large amount of total ionizing radiation delivered along with the neutron irradiation. A new family of neutron generators based on a deuterium-tritium (D-T) or deuterium-deuterium (D-D) reaction are capable of delivering orders of magnitude more neutron irradiation without a significant increase in total ionizing dose.

DETAILED DESCRIPTION OF THE INVENTION

Figure 1:
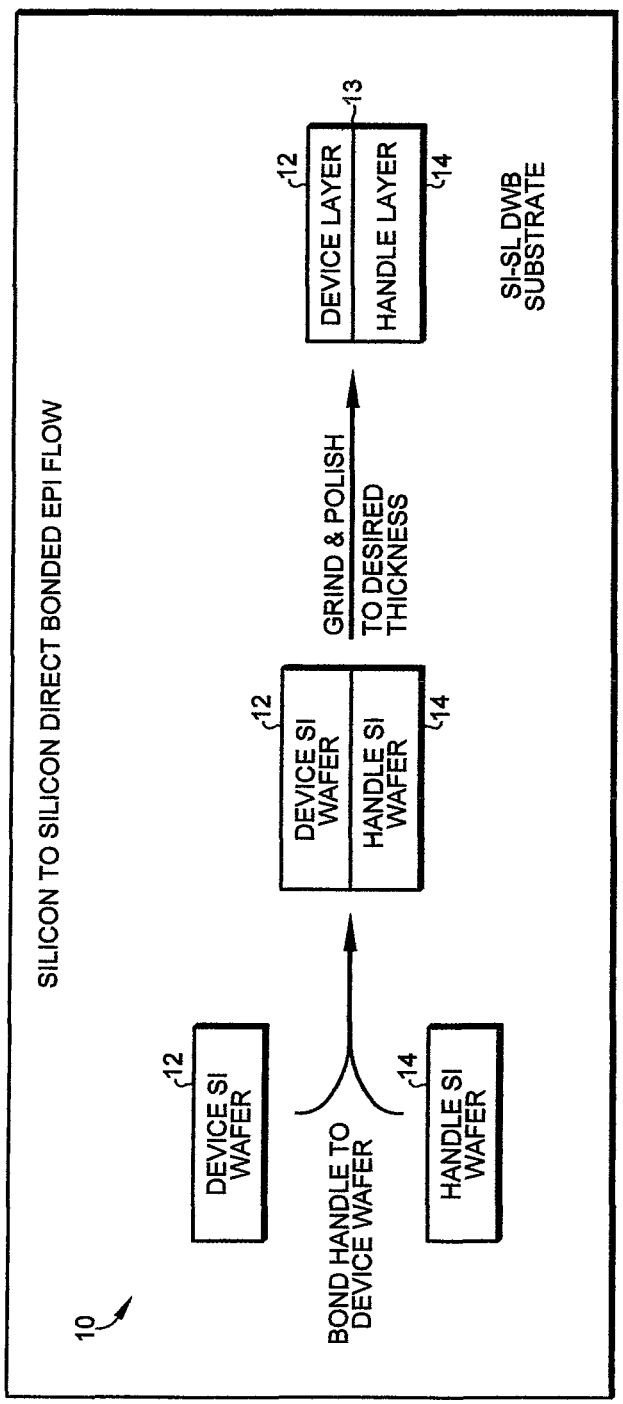
FIG. 1 is a flow chart of a directed wafer bonding (DWB) method showing a silicon-to-silicon direct bonded flow according to the present invention.

Referring now to FIG. 1, a flow chart 10 of a directed wafer bonding (DWB) method shows a silicon-to-silicon directed bonded epitaxial flow according to the present invention. The method shown in FIG. 1 is suitable for fabricating photodiodes, but other semiconductor structures can also be fabricated. In general, a silicon device wafer 12 is bonded to a silicon handle wafer 14. The silicon wafers are typically eight inch wafers each having a thickness of about 725 microns. Other wafer sizes can obviously be used. The wafers each have separate doping profiles, and can be the same or a different polarity type as will be explained in further detail below. The bonding operation can be accomplished in a variety of different ways. For example a bonding agent such as nitric acid mixed with hydrogen peroxide can be used, followed by a thermal step of baking at 200 degrees to 1,200 degrees Celsius for 1 to 4 hours. Alternatively, a bonding agent such as a chemical vapor deposited (CVD) oxide film on at least one of the two wafers being bonded can also be used, followed by bonding at a temperature from 200 to 1,300 degrees Celsius, further followed by thinning the bonded wafer structure to the desired final thickness, further followed by a thermal step of baking at 600 to 1,300 degrees for 1 second to 10 hours in a reducing atmosphere containing hydrogen and nitrogen to eliminate the insulating material at the wafer bond interface. Once the wafers are bonded together, they are ground and polished according to known methods in the art. The device wafer is ground down to a thickness of about one to ten microns. The exact depth can change, and can in fact be greater than ten microns if desired. The handle wafer need not be ground down, or only ground down slightly so that the total bonded wafer thickness is about 725 microns for a 200 mm diameter wafer, such that the combination wafer is readily processed in conventional semiconductor processing equipment. As is explained in further detail below, the device layer 12 is now readily used for conventional semiconductor processing to make any manner of electronic circuits. The direct wafer bonding method 10 of the present invention allows a much higher resistivity device layer than conventional epitaxy or diffusion due to the lower overall diffusion-time product (DT product) to produce a bonded structure compared to epitaxy.

Figure 2:
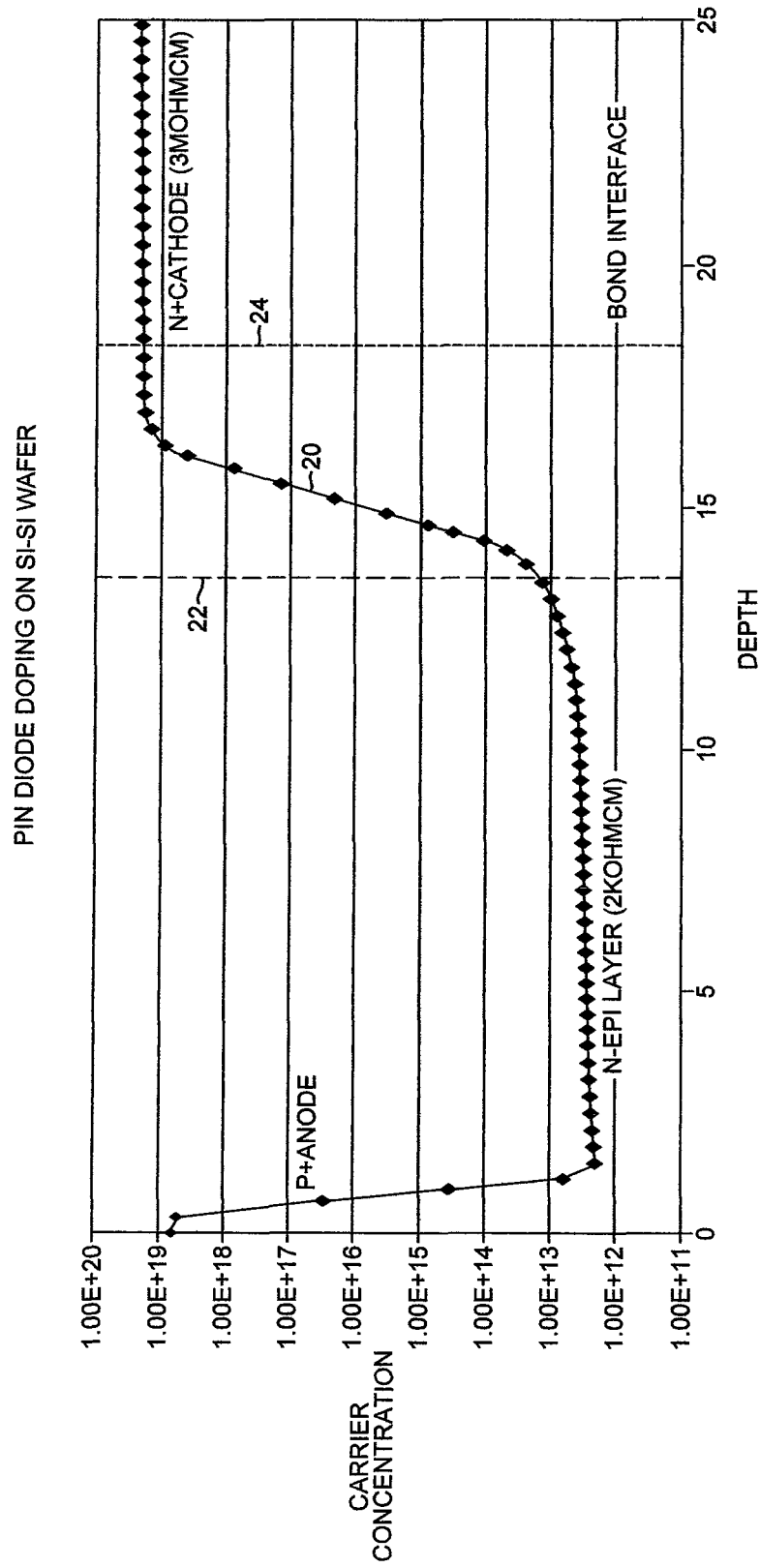
FIG. 2 is a graph of a DWB doping profile according to the present invention, showing the doping density of a handle wafer, the doping density of a device wafer, and the abrupt transition between the two doping densities in an interface region.

Referring now to FIG. 2, a graph of a DWB doping profile according to the present invention shows the doping density of a handle wafer, the doping density of a device wafer, and the abrupt transition between the two doping densities in an interface region. In the example of FIG. 2, a PiN diode doping profile is shown. The doping profile will of course be different for different semiconductor devices. The example of FIG. 2 is presented to clearly illustrate the abrupt transition between the device layer and the handle wafer. Thus, the doping density value 20 is shown to be about $1E19$ ions/cm$^3$ in a p+ anode, down to a depth of about two microns as shown. From two to about 13 microns, the doping density value 20 is about $1E12$ ions/cm$^3$ (2,000 Ohm-cm). The device layer is shown to be of the n− doping type in FIG. 2. From a depth of about 13 microns to 19 microns, a transition region is shown. A first boundary of the transition region is shown at 22, which is physically within the device layer 12. The increase in the transition region doping value 20 from about $1E12$ ions/cm$^3$ to $1E19$ ions/cm$^3$ is due to out diffusion from the highly doped handle wafer 14. Finally, the bond interface between the two wafer layers is shown at 24 at a depth of about 19 microns. The handle layer forms the n+ cathode of the PiN diode, with a doping density of about $1E19$ ions/cm$^3$.

Ideally, a one-sided step junction is formed with greater than six orders of magnitude difference in carrier concentration within a depth of about six microns. (One order of magnitude change in carrier concentration per micron of depth.) The handle wafer resistivity is made extremely low, less than 0.01 Ohm-cm being preferred.

Figure 3:
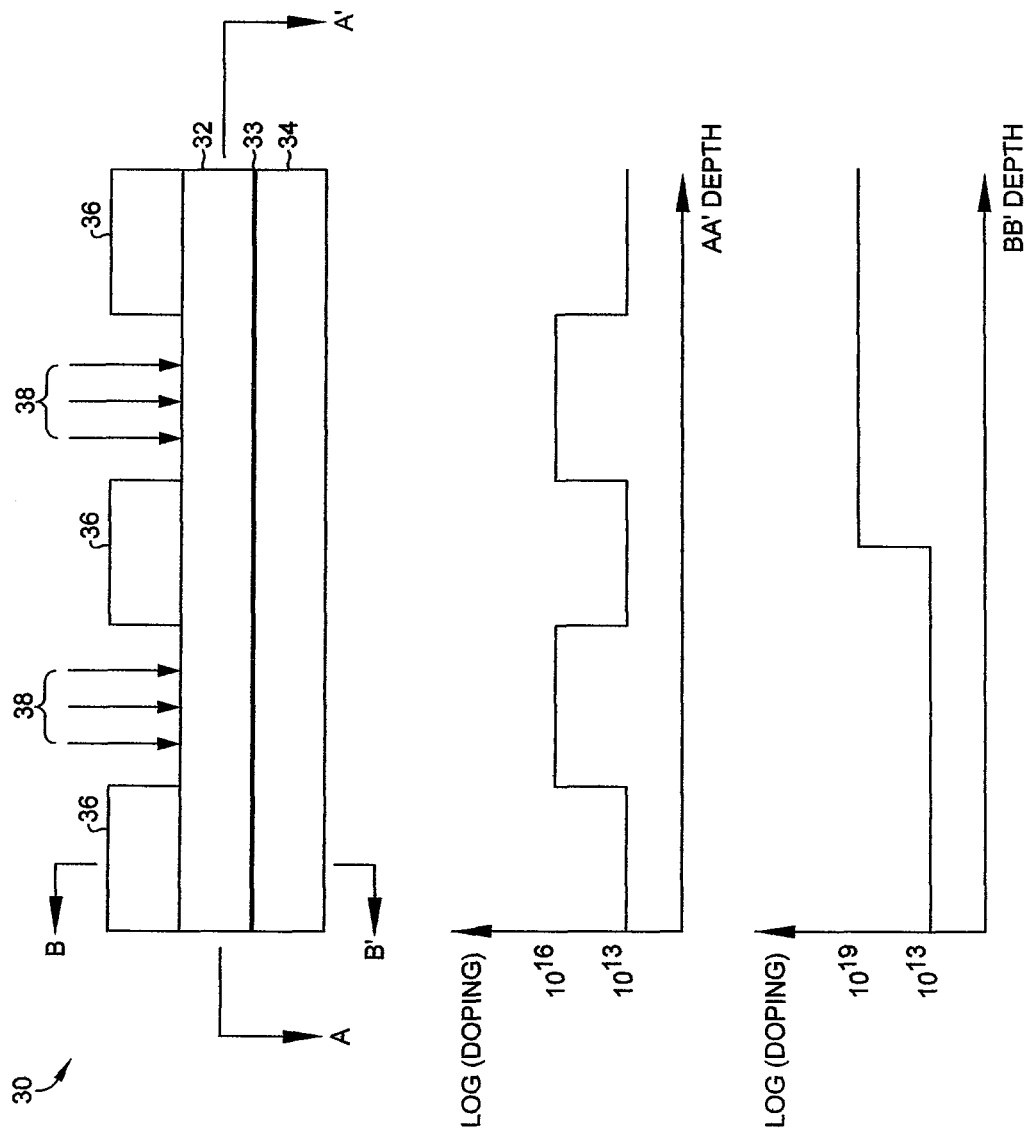
FIG. 3 is an illustration of a bonded wafer according to the present invention, and the corresponding perpendicular and parallel conductivity profiles thereof.

Referring now to FIG. 3, an illustration of a bonded wafer 30 according to the present invention, and the corresponding perpendicular (B-B') and parallel (A-A') conductivity profiles thereof. In the top portion of FIG. 3, a bonded wafer 30 is shown having a device layer 32 and a handle wafer 34. A mask layer 36 is patterned such that dopants 38 can be implanted. In the middle portion of FIG. 3, a first cross section A-A' is parallel to the surface of the device layer 32, with the cross section being taken through the middle of the device layer. Note that, due to the dopant implantation, the doping profile through A-A' can vary, for example, from $1E13$ ions/cm$^3$ in the non-implanted regions to $1E16$ ions/cm$^3$ in the implanted regions. In the bottom portion of FIG. 3, a second cross section B-B' is perpendicular to the surface of the device layer 34, with the cross section being taken through the device layer 32 and the handle wafer layer 34. Note that, since the cross section B-B' extends through the device layer 34 in a non-implanted region, and into the heavily doped handle wafer, the doping density changes from about $1E13$ ions/cm$^3$ to $1E19$ ions/cm$^3$, with an abrupt transition region.

Figure 4:
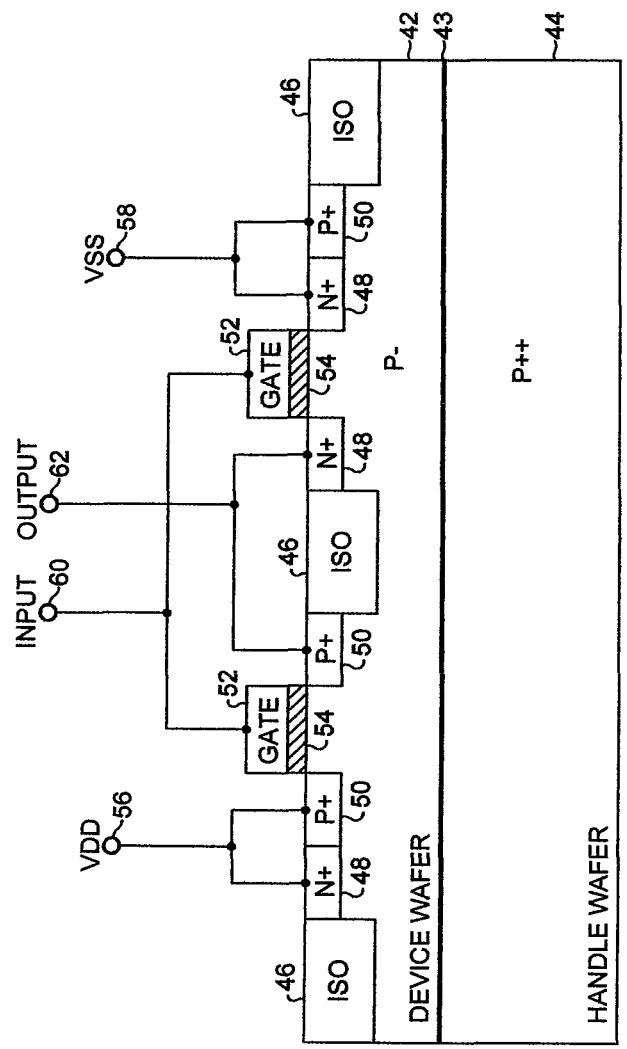
FIG. 4 is an illustration of a bonded wafer according to the present invention including an integrated circuit fabricated in the device wafer.

Referring now to FIG. 4, an illustration of a bonded wafer 40 is shown according to the present invention including an integrated circuit (an inverter) fabricated in the device wafer 42. Although a simple inverter is shown in FIG. 4, it will be appreciated by those skilled in the art that many other devices can be built in the device wafer using similar doped regions, isolation regions, and gate layers as shown. In FIG. 4, a handle wafer 44 is shown having a p++ doping profile. A p− device layer 42 is also shown. In the device layer 42, isolation regions, typically oxide regions, are shown. Doped regions 48 (n+) and 50 (p+) are also shown. Patterned gate oxide regions 54, and metal gate contacts 52 are also shown. As is known in the art, the doped regions are coupled together to form a VDD contact 56, an input 60, an output 62, and a VSS contact 58. The exact structure shown in FIG. 4 is illustrative of one type of circuit that can be fabricated in the device layer 42 of the bonded wafer 40 according to the present invention.

In a first embodiment of the present invention, a wafer structure includes a first region (from the device wafer) 12 having at least one major surface, a thickness and a conductivity profile of a first conductivity type substantially perpendicular to the at least one major surface, a second region (from the handle wafer) 14 having a thickness and a second conductivity profile of the first conductivity type of the first region 12, such second conductivity profile being substantially different than the conductivity profile of the first region 12, such that the second region 14 is in electrical contact with the first region opposite the major surface of the first region, an interface region 13 being formed between the first region 12 and the second region 13, and impurity sites placed in at least one of the first region 12, the second region 14, and the interface region 13, such impurity sites being substantially electrically inactive over a predetermined temperature range (−75° C. to +200° C. degrees), wherein the conductivity profile of the first region 12 transitions abruptly (greater than one order or magnitude per one micron) to the conductivity profile of the second region 14 within the interface region 13.

The first region 12, the second region 14, and the interface region 13 each comprises a semiconductor material such as silicon, gallium arsenide, or germanium. The impurity sites are selected from the group of isotopes of germanium, silicon, carbon, fluorine, sulfur, chlorine, nitrogen, or defects selected from the group of lattice vacancies, interstitial defects, Frenkel defect pairs, crystal dislocations, or other defects such as strained layers of the semiconductor lattice, or a combination of said isotopes and defects. The impurity sites are incorporated into at least one of the first region 12, the second region 14, and the interface region 13 by way of ion implantation, diffusion from a solid, liquid, or gaseous source, during growth of an epitaxial layer, bombardment by heavy ions, neutrons, protons, or electrons, or a combination thereof. The impurity sites can be introduced into the separate device layer 12, the separate handle wafer 14, and also the combination of the two wafers once bonded, and ground to the desired thickness, which would also then include the interface region 13. One, two, or all three of these introduction steps may be performed as desired for a specific application.

The introduction of defects using neutron bombardment is especially problematic due to the undesirable side effects of displacement damage and total ionizing dose degradation that are unavoidable with many neutron sources such as nuclear reactors. However, the present invention solves this problem by using a high energy, nearly monoenergetic source of neutrons with an energy in the range of 10 to 50 MeV, with 32 MeV being the preferred energy. Furthermore, the total fluence is optimized to provide the optimum defect concentration in the first region 12, and the interface region 13. Neutron fluences range from about 2E12 neutrons/cm$^2$ to 2E14 neutron/cm$^2$, with 2E13 neutrons/cm$^2$ being preferred. The neutron source used ideally has low emission of ionizing electromagnetic radiation, and is ideally a spallation source, wherein neutrons are generated by nuclear reaction in a material caused by bombardment with a charged particle beam, with a proton ion beam being the preferred charged particle beam.

The device layer 12 is now well suited for making electronic circuits that are substantially immune to SEL, because the charge collection region for such events has been limited to device layer 12, and the minority carrier lifetime contributing to the gain of the parasitic SCR devices that cause SEL has been lowered substantially due to the incorporation of impurity sites as defined above. In reduced thickness of the device layer 12 enabled by the lower DT product, also reduces the overall SEU error rate of an IC in a particular radiation environment by limiting the amount of collected charge. The incorporation of impurity sites in the first Region 12 is also designed to inhibit the diffusion of certain dopants at the silicon:silicon-dioxide interface, thus pinning the surface potential at such interfaces such that the inevitable TED-induced trapping of positive charge in the overlying dielectric layers, including silicon dioxide, does not cause the silicon surface to change its surface potential substantially, in particular preventing the silicon surface potential from inverting from one conductivity type to the opposite conductivity type during or after exposure to ionizing radiation. The incorporation of impurity sites, as defined above, into the interface region 13 also acts to retard the diffusion of dopants from the second region 14, thus preventing an increase in the conductivity of the first region 12. Such increase in the conductivity of first region 12 is deleterious to the electrical performance of the IC, causing an increase in reverse bias junction leakage of the IC, and in sever cases an unacceptable threshold voltage shift in the MOS transistors of the IC, and/or a decrease in the mobility of the channel regions of such MOS transistors of the IC. Impurity sites incorporated into the second region 14 are also effective in retarding diffusion of dopants from the second region 14 into the first region 12 through the interface region 13.

Typically, the structure of the present invention is formed whereby the first region 12 and the second region are formed of two distinct substrates from two different wafers that are subsequently bonded together and then ground down to a desired final thickness. Advances in epitaxy or diffusion, however, may permit the abrupt change in carrier concentration (greater than one order of magnitude for one micron of depth) to be accomplished in a single wafer. The present invention contemplates a single substrate embodiment fabricated using these advanced epitaxy and diffusion techniques. Organic chemical vapor deposition (MOCVD) could also be used to form the device layer 12.

The structure of the present invention contemplates that the first conductivity type is either p-type or n-type. At least one of the first region 12, the second region, and the interface region incorporates at least one dopant. The wafers may be separately doped and bonded. Additional doping can be accomplished once the bonding step has been completed. The dopant is selected from the group of isotopes including boron, phosphorous, arsenic, antimony, aluminum, gallium, or a combination thereof. The incorporation of the at least one dopant into at least one of the first region 12, the second region 14, and the interface region 13 is accomplished by way of ion implantation, diffusion from a solid, liquid, or gaseous source, during growth of an epitaxial layer, or a combination thereof. Again, this can be done with separate wafers 12 and 14, but additional processing can be done once the wafers have been bonded together.

In the present invention, the transition of the conductivity profile that occurs abruptly in the interface region 13 is at least one order of magnitude of conductivity per micron of thickness. The thickness of the first region 12 is made sufficient for manufacturing at least one active semiconductor device therein. Typically, this thickness will be about one to ten microns, or slightly deeper if desired for a particular application. The combined thicknesses of the first region 12, the second region 14, and the interface region 13 is made to conform with standards for ease of processing on semiconductor manufacturing equipment. For example, a combined thickness of about 725 microns for present manufacturing equipment is deemed to be desirable.

The structure of the present invention can include at least one active semiconductor device that does not latch-up during irradiation with protons, neutrons, heavy ions, or bursts of gamma rays, electrons, or other particles or waves that cause ionization in the at least one active semiconductor device. As mentioned above, the semiconductor device will be inherently immune to latch-up because the charge collection region has been limited without compromising the conductivity of device region 12, and because the gains of the parasitic SCR devices that are inherent in CMOS IC's have been sufficiently reduced to the point where such deposited charge cannot induce a latch-up in such parasitic SCR devices. The heavy ions comprise an ion beam with an effective linear energy transfer in silicon greater than or equal to 0.1 MeV cm$^2$/mg. The protons comprise a beam of protons with an effective linear energy transfer in silicon greater than zero but less than or equal to 1 MeV cm$^2$/mg. The irradiation comprises a neutron environment with an energy distribution within the range of 0.1 MeV to 100 MeV. Gamma ray and/or electron bursts comprise events with durations from 1 to 1,000 nanoseconds with dose rates from 1E4 to 1E12 rad(Si)/second. The thickness of the said first region 12 is no greater than that calculated to limit the charge collection arising from the heavy ion irradiation. Because the energy loss per unit length varies for different ions the maximum LET value for which latch-up immunity is achieved can be varied by varying the charge collection volume. In other words, the latch-up immunity is determined by the process parameters selected.

The structure of the present invention includes at least one circuit made up of a plurality of active semiconductor devices. The circuit can comprise at least one circuit selected from the group of analog to digital converter, digital to analog converter, voltage regulator, voltage reference, voltage monitor, operational amplifier, comparator, microprocessor, microcontroller, static random access memory, dynamic random access memory, rf transmitters, if demodulators, system clock, sensor interface, or analog filter. The circuit is typically incorporated in a system selected from the group of satellite telemetry control, satellite attitude control, satellite sensors, satellite communications, satellite reaction wheel, satellite antenna. In turn, the system is incorporated into at least one of the group of launch vehicle, orbiter, satellite, missile, manned spacecraft, and other vehicles intended for high altitude (altitudes greater than 50,000 feet) operation. However the achieved latch-up immunity can also be used in developing parts used in high radiation environments such as reactors, medical radiation facilities and research facilities such as accelerators.

Figure 6:
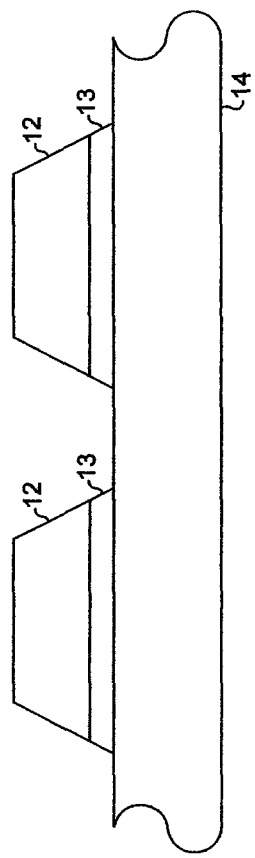
FIG. 6 is an illustration of a wafer structure according to the present invention wherein the device region is not co-extensive with the handle wafer.

In the structure of the present invention, the first region 12 can be made either co-extensive or not co-extensive with the second region 14, as shown in the wafer structure 600 of FIG. 6. In one case the regions of the first region 12 that are not co-extensive with the second region 14 act as isolation regions between, for example, bipolar junction transistors. Two interface regions 13 can also be seen in the wafer structure 600 of FIG. 6.

Figure 5:
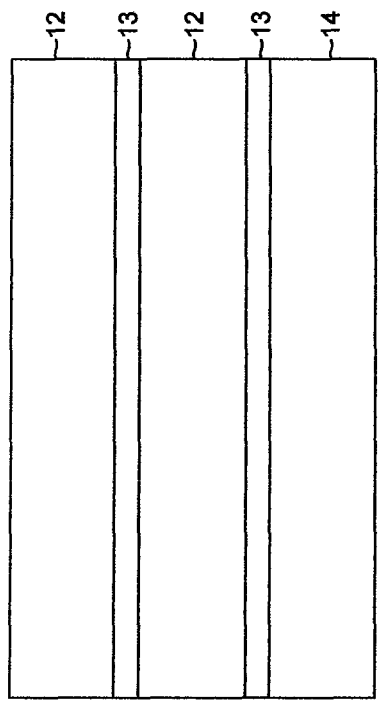
FIG. 5 is an illustration of a wafer structure according to the present invention containing multiple interface regions.

In the structure of the present invention, at least one additional region having a thickness and a conductivity profile of the first conductivity type of the first region may be included, and at least one additional interface region between the first region and the at least one additional region may also be included as shown in the wafer structure 500 of FIG. 5. Such additional interface region may comprise an epitaxial wafer used as one of two wafers bonded together, the epitaxial wafer already incorporating an interface region. Alternatively, a wafer structures with multiple interface regions can be constructed through multiple wafer bonding steps, each bonding step being followed with grinding and polishing steps such that the distance between the multiple interface regions can be controlled. The wafer structure 500 of FIG. 5 shows two first regions 12, two interface regions 13, and a second region 14.

In the first embodiment of the invention, the device wafer 12 and the handle wafer were of the same conductivity type (both either p-type or n-type) but with markedly different doping profiles as was shown in FIG. 2. In a second embodiment of the invention, the device wafer 12 and the handle wafer 14 are of the opposite conductivity type (p-type and n-type, or n-type and p-type, respectively). A typical bonded wafer according to the second embodiment of the invention is an n-type handle wafer 14 having a resistivity of less than 0.01 Ohm-cm, and a p-type device wafer 12 having a resistivity of 100 Ohm-cm.

According to a second embodiment of the invention, a wafer structure includes a first region 12 having at least one major surface, a thickness, and a conductivity profile of a first conductivity type substantially perpendicular to said at least one major surface, a second region 14 having a thickness, and a second conductivity profile of a second conductivity type opposite to that of said first region, such that said second region is in electrical contact with said first region opposite the major surface of said first region, an interface region 13 formed between said first region and said second region, and impurity sites placed in at least one of said first region, said second region, and said interface region, such impurity sites being substantially electrically inactive over a temperature range, wherein the conductivity profile of said first region transitions abruptly to the conductivity profile of said second region within the interface region. The primary difference between this embodiment and the first is the direct formation of a junction and the use of a different conductivity type substrate.

In a third embodiment of the present invention, the parallel conductivity profile of the device layer 32, best shown in FIG. 3 is emphasized. In the third embodiment of the present invention, the device layer 32 has a parallel conductivity profile due to implantation 38 in unmasked areas of the surface thereof. This is particularly shown in cross section A-A' of FIG. 3, as previously described. In the third embodiment of the present invention, the device layer 32 and the handle wafer 34 are of the same conductivity type, either p-type or n-type. According to the third embodiment of the present invention, a wafer structure 30 includes a first region 32 having at least one major surface, a thickness, and a conductivity profile of a first conductivity type substantially parallel to said at least one major surface, a second region 34 having a thickness, and a second conductivity profile of the first conductivity type of said first region, such second conductivity profile being substantially different than the conductivity profile of said first region, such that said second region is in electrical contact with said first region opposite the major surface of said first region, an interface region 33 formed between said first region and said second region, and impurity sites placed in at least one of said first region, said second region, and said interface region, such impurity sites being substantially electrically inactive over a temperature range, wherein the conductivity profile of said first region transitions abruptly to the conductivity profile of said second region within the interface region.

In a fourth embodiment of the present invention, the parallel conductivity profile of the device layer 32, best shown in FIG. 3 is again emphasized. In the third embodiment of the present invention, the device layer 32 has a parallel conductivity profile due to implantation 38 in unmasked areas of the surface thereof. This is particularly shown in cross section A-A' of FIG. 3, as previously described. In the third embodiment of the present invention, the device layer 32 and the handle wafer 34 are of the opposite conductivity type, either p-type and n-type, or n-type and p-type, respectively. According to the fourth embodiment of the present invention, a wafer structure 30 includes a first region 32 having at least one major surface, a thickness, and a conductivity profile of a first conductivity type substantially parallel to said at least one major surface, a second region 34 having a thickness, and a second conductivity profile of a second conductivity type opposite to that of said first region, such that said second region is in electrical contact with said first region opposite the major surface of said first region, an interface region 33 formed between said first region and said second region, and impurity sites placed in at least one of said first region, said second region, and said interface region, such impurity sites being substantially electrically inactive over a temperature range, wherein the conductivity profile of said first region transitions abruptly to the conductivity profile of said second region within the interface region.

In a fifth embodiment of the invention, the integrated circuit nature of the wafer structure of the present invention is emphasized. The integrated circuit nature of the wafer structure is best seen in FIG. 4, previously described. A radiation hardened integrated circuit 40 according to the fifth embodiment of the present invention includes a plurality of semiconductor devices (represented by doped regions 48 and 50, isolation regions 46, and gate contacts 52) formed in a wafer structure, said wafer structure including a first region 42 having at least one major surface, a thickness, and a conductivity profile of a first conductivity type substantially perpendicular to said at least one major surface, a second region 44 having a thickness, and a second conductivity profile of the first conductivity type of said first region, such second conductivity profile being substantially different than the conductivity profile of said first region, such that said second region is in electrical contact with said first region opposite the major surface of said first region, an interface region 43 formed between said first region and said second region, and impurity sites placed in at least one of said first region, said second region, and said interface region, such impurity sites being substantially electrically inactive over a temperature range, wherein the conductivity profile of said first region transitions abruptly to the conductivity profile of said second region within the interface region.

In a sixth embodiment of the invention, forming of the impurity sites by high energy bombardment is emphasized. The following description will generally refer again to FIG. 1, and also to additional FIGS. 7 and 8.

Thus, in FIG. 1, a wafer structure 10 includes a first region 12 having at least one major surface, a thickness, and a conductivity profile of a first conductivity type substantially perpendicular to said at least one major surface, a second region 14 having a thickness, and a second conductivity profile of the first conductivity type of said first region, such second conductivity profile being substantially different than the conductivity profile of said first region, such that said second region is in electrical contact with said first region opposite the major surface of said first region, an interface region 13 formed between said first region and said second region, and impurity sites placed in at least one of said first region, said second region, and said interface region, by bombardment of high energy monoenergetic neutron irradiation. At least one of said first region 12, said second region 14, and said interface region 13 includes a semiconductor material, for example silicon, and the completed material has been treated with high-energy monoenergetic neutron irradiation. The monoenergetic neutron energy can be between 1 MeV and 14-MeV and can be created by a Deuterium-Deuterium (D-D) reaction. The first region 12 and the second region 14 can be formed by two distinct substrates and either the first or second region, or both are bombarded by the high-energy, monoenergetic neutrons. The formation can be bonding and either the first or second region, 12 or 14, or both are bombarded by high-energy monoenergetic neutrons before or after processing. The first region 12 and the second region 14 can also be formed in a single substrate that has been altered by high-energy monoenergetic neutron irradiation to provide for said first region, said second region, and said interface region. The first region 12 can include an epitaxial layer deposited upon said second region 14 and the completed material has been treated with high-energy monoenergetic neutron irradiation. The first region 12 can be a layer deposited upon the second region 14 by metal organic chemical vapor deposition (MOCVD) and the completed material has been treated with high-energy monoenergetic neutron irradiation. The first conductivity type is selected from the group of p-type or n-type. The conductivity profile of the at least one of said first region 12, said second region 14, and said interface region 13 incorporates at least one dopant and the structure is treated with high-energy monoenergetic neutron irradiation. The dopant is selected from the group consisting of isotopes of boron, phosphorous, arsenic, antimony, aluminum, gallium, or a combination thereof. The incorporation of at least one dopant into at least one of said first region 12, said second region 14, and said interface region 13 can be accomplished by way of ion implantation, diffusion from a solid, liquid, or gaseous source, during growth of an epitaxial layer, or a combination thereof. The transition of a conductivity profile that occurs abruptly in the interface region is at least one order of magnitude of conductivity per micron of thickness. The first region thickness is sufficient for manufacturing at least one active semiconductor device therein, which device is ideally substantially immune to latch-up during irradiation with protons, neutrons, or heavy ions. The heavy ions can comprise a beam of heavy ions with an effective linear energy transfer in silicon greater than or equal to 0.1 MeV cm$^2$/mg. The protons can comprise a beam of protons with an effective linear energy transfer in silicon greater than zero but less than or equal to 1 MeV cm$^2$/mg. The irradiation can comprise a neutron environment with an energy distribution within the range of 0.1 MeV to 100 MeV. The thickness of said first region 12 can be no greater than that calculated to truncate the charge collection of said heavy ion irradiation. The finished structure shown in FIG. 1 can include at least one circuit made up of a plurality of active semiconductor devices. The circuit can be selected from the group of analog to digital converter, digital to analog converter, voltage regulator, voltage reference, voltage monitor, operational amplifier, comparator, microprocessor, microcontroller, static random access memory, dynamic random access memory, RF transmitters, IF demodulators, system clock, sensor interface, or analog filter. The circuit is ideally incorporated in a system selected from the group of satellite telemetry control, satellite attitude control, satellite sensors, satellite communications, satellite reaction wheel, or satellite antenna. The system is incorporated into at least one of the group of launch vehicle, orbiter, satellite, missile, manned spacecraft, and other vehicles intended for high altitude operation. The first region 12 can be co-extensive with the second region 14. Alternatively, the first region 12 is not co-extensive with the second region 14. The structure of the present invention can comprise at least one additional region having a thickness and a conductivity profile of the first conductivity type of said first region, and at least one additional interface region between said first region and said at least one additional region, as previously discussed. The combined thicknesses of said first region 12, said second region 14, and said interface region 13 conforms with a predetermined standard for processing on semiconductor manufacturing equipment.

A method of forming a wafer structure 10 according to the present invention includes forming a first region 12 in a device wafer having at least one major surface, a thickness, and a conductivity profile of a first conductivity type substantially perpendicular to said at least one major surface, forming a second region 12 in a handle wafer having a thickness, and a second conductivity profile of the first conductivity type of said first region, such second conductivity profile being substantially different than the conductivity profile of said first region, such that said second region is in electrical contact with said first region opposite the major surface of said first region, bonding together said device and handle wafers, forming an interface region 13 formed between said first region 12 and said second region 14, and placing impurity sites in at least one of said first region, said second region, and said interface region by high-energy monoenergetic neutron bombardments. The method can include grinding said bonded device and handle wafers, the structure having been treated with high-energy monoenergetic neutron bombardments. The method can also include treating the wafer structure with a high-energy monoenergetic neutron source obtained from a deuterium-tritium reaction. The method can also include treating the wafer structure with a high-energy monoenergetic neutron source obtained from a deuterium-deuterium reaction. The method can also include treating the wafer structure with a high-energy monoenergetic neutron source obtained from a secondary reaction of charged particles. The method can also include treating the wafer structure with a high-energy monoenergetic neutron source obtained from a secondary reaction of protons.

A high-energy monoenergetic neutron source according to the present invention is further described below with respect to FIGS. 7 and 8.

A monoenergetic neutron source suitable for cost-effective semiconductor treatment is a pumped, drift tube accelerator which may be used as a positive ion or an electron accelerator. For neutron generation, the source is configured as a deuteron accelerator using either a tritium- or deuterium-impregnated metal film target. Neutron yields up to $2 \times 10^{11}$ n/s may be achieved using a tritiated titanium target, with yields of up to $1 \times 10^9$ n/s using a deuterated target.

The neutrons are created by deuterium ions accelerating into a tritium or deuterium target yield the following energies:

$$D+T \rightarrow n + {}^4He \quad E_n = 14.2 \text{ MeV}$$

$$D+D \rightarrow n + {}^3He \quad E_n = 2.5 \text{ MeV}$$

Neutrons produced from the D-T reaction are emitted isotropically (uniformly in all directions) from the target. Neutron emission from the D-D reaction is slightly peaked in the forward (along the axis of the ion beam) direction. In both cases, the He nucleus (alpha particle) is emitted in the exact opposite direction from the neutron.

Neutron fluence at 14 MeV is determined using radioactivation techniques, employing the standard method described in ASTM publication E 496-96. Where possible, niobium activation foils are placed on the samples during exposure. After completion of the irradiation, activity levels of these foils are read using an NaI gamma-ray spectrometer. Neutron fluence determination at 2.5 MeV is similar, except that uranium foils are used.

Figure 7:
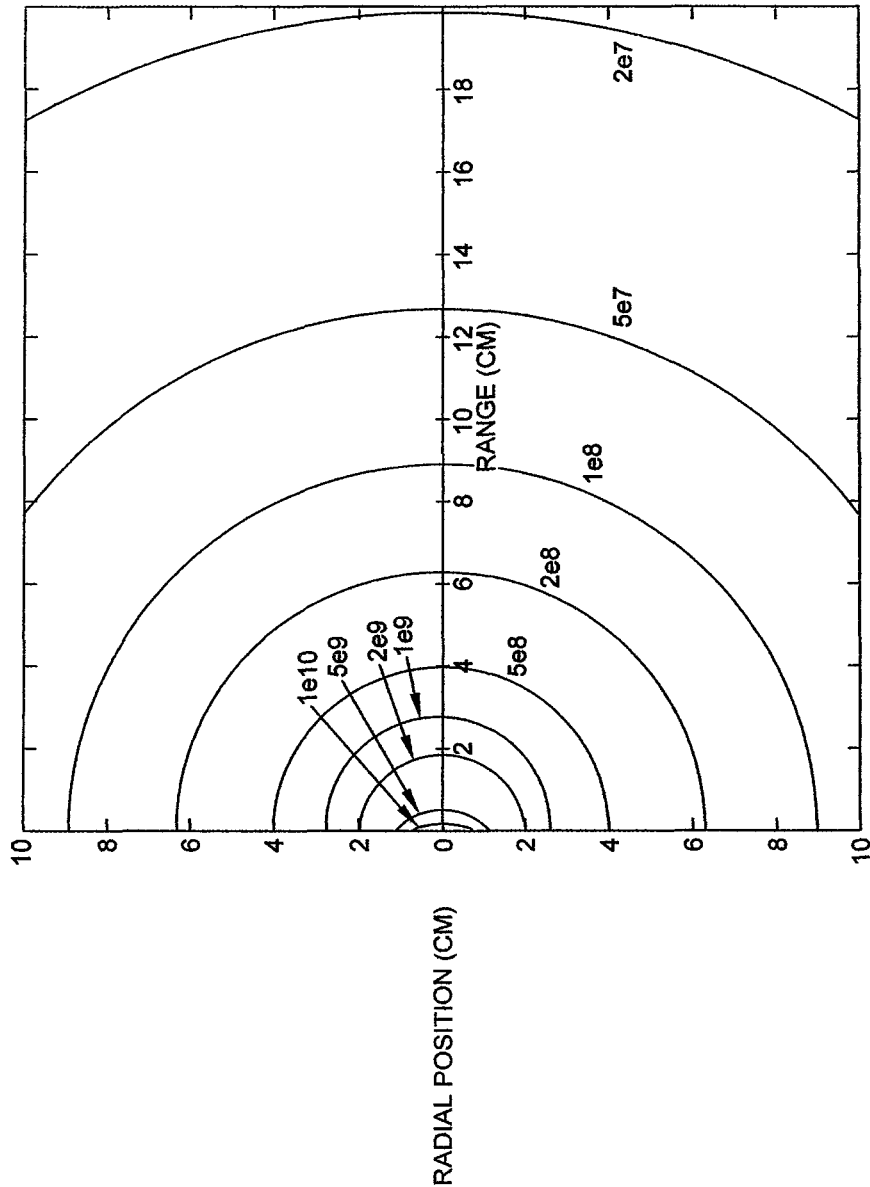
FIG. 7 is a plot of neutron flux (14 MeV), for a total source output of $1 \times 10^{11}$ n/s, according to the present invention.

FIG. 7 shows a two-dimensional map of 14 MeV neutron flux as a function of distance from the source, for a source output of $1 \times 10^{11}$ n/s. The contours deviate from a purely $1/r^2$ dependence at close range, because of the finite size of the source.

Figure 8:
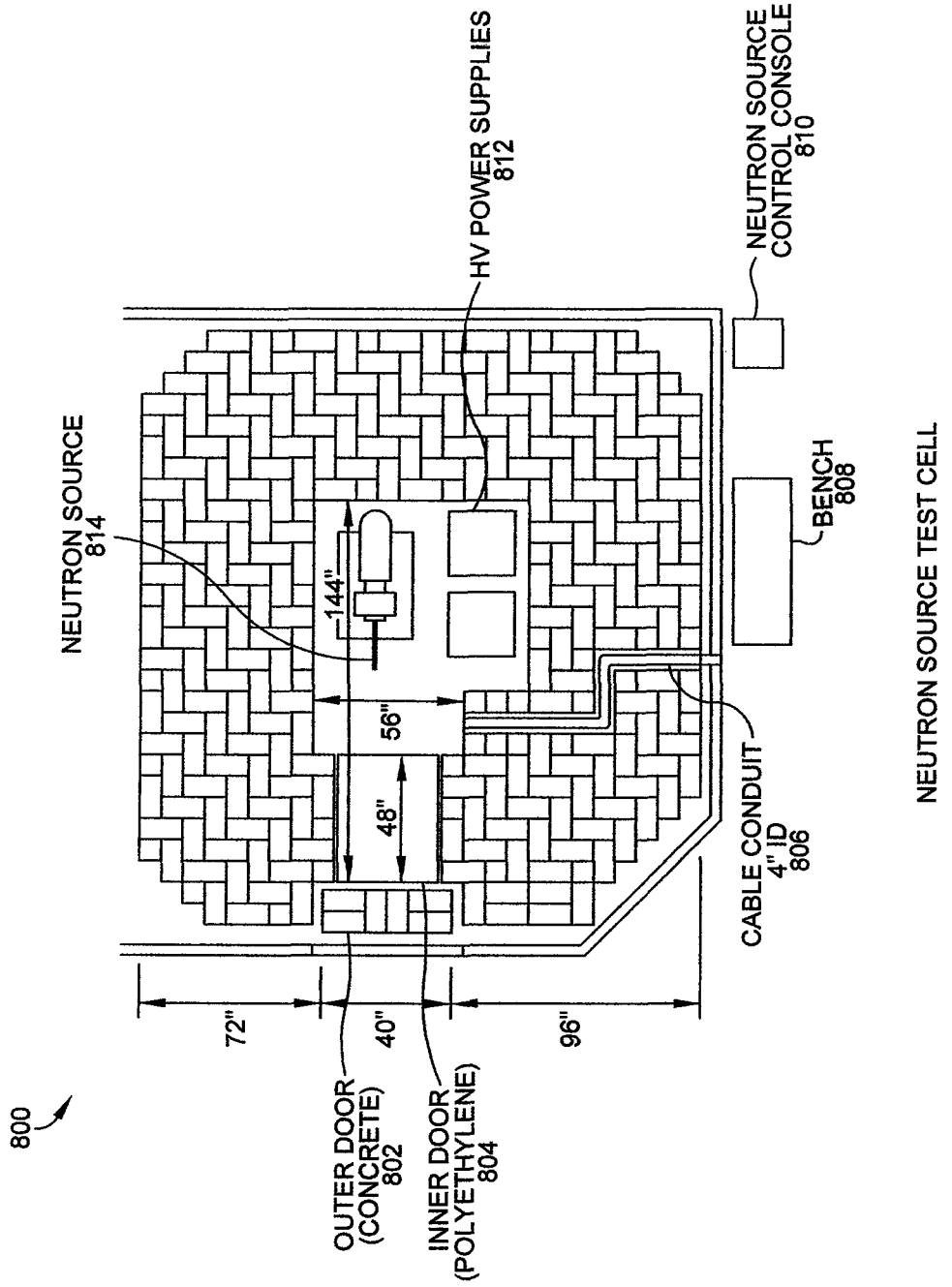
FIG. 8 is a schematic diagram of a neutron source test cell according to the present invention.

An irradiation cell design, layout, and operation is shown in further detail in FIG. 8. A plan view of the neutron irradiation test cell 800 is shown in FIG. 8. The cell has interior dimensions of approximately 5 ft by 8 ft, with walls formed of solid concrete block. Wall thickness is approximately 80 inches. Access to the test cell is provided by a double-wall door arrangement, consisting of a 48-inch-thick wooden structure filled with polyethylene beads and a 16-inch-thick concrete door. Both doors roll on tracks set on the concrete floor. An outer door 802 and inner door 804 are shown in FIG. 8. Also shown in FIG. 8 are cable conduit 806, bench 808, neutron source control console 810, HV power supplies 812, and neutron source 814.

Sample holders fabricated from aluminum or other suitable structural material are situated in the inside of the test cell. It should be noted that whole semiconductor wafers containing completed integrated circuits, individual completed integrated circuits in die form, and/or packaged integrated circuits may be irradiated using the appropriate sample holders.

It will be apparent to those skilled in the art that various modifications and variations can be made to the invention without departing from the spirit or scope of the invention. Thus, it is intended that the present invention covers the modifications and variations of this invention provided they come within the scope of the appended claims and their equivalents.

We claim:

1. A wafer structure comprising:
    a first region from a device wafer having at least one major surface, a thickness, and a conductivity profile of a first conductivity type substantially perpendicular to said at least one major surface;
    a second region from a separate handle wafer having a thickness, and a second conductivity profile of a second conductivity type opposite to that of said first region, such that said second region is in electrical contact with said first region opposite the major surface of said first region;
    a bond interface region formed between said first region and said second region; and
    impurity sites placed in said first region, such impurity sites being substantially electrically inactive over a temperature range,
    wherein the conductivity profile of said first region transitions abruptly to the conductivity profile of said second region within the interface region,
    wherein said first region, said second region, and said interface region comprise the same semiconductor material, and
    wherein said impurity sites are selected from the group of isotopes consisting of germanium, silicon, carbon, fluorine, sulfur, chlorine, nitrogen, or defects selected from the group consisting of lattice vacancies, interstitial defects, Frenkel defect pairs, crystal dislocations, or a combination of said isotopes and defects.

2. The structure of claim 1 wherein said first region, said second region, and said interface region comprises silicon.

3. The structure of claim 1 wherein said impurity sites are incorporated into said first region, by ion implantation, diffusion from a solid, liquid, or gaseous source, during growth of an epitaxial layer, bombardment by heavy ions, neutrons, protons, or electrons, or a combination thereof.

4. The structure of claim 1 wherein the said first conductivity type is selected from the group of p-type or n-type.

5. The structure of claim 1 wherein the said conductivity profile of the at least one of said first region, said second region, and said interface region incorporates at least one dopant.

6. The structure as in claim 5 wherein said dopant is selected from the group consisting of isotopes of boron, phosphorous, arsenic, antimony, aluminum, gallium, or a combination thereof.

7. The structure as in claim 5 wherein the incorporation of said at least one dopant into at least one of said first region, said second region, and said interface region is accomplished by way of ion implantation, diffusion from a solid, liquid, or gaseous source, during growth of an epitaxial layer, or a combination thereof.

8. The structure as in claim 1 wherein the transition of said conductivity profile that occurs abruptly is at least one order of magnitude of conductivity per micron of thickness.

9. The structure as in claim 1 wherein the said first region thickness is sufficient for manufacturing at least one active semiconductor device therein.

10. The structure as in claim 9 wherein at least one said active semiconductor device is substantially immune to latch-up during irradiation with protons, neutrons, or heavy ions.

11. The structure as in claim 10 wherein the said heavy ions comprise a beam of heavy ions with an effective linear energy transfer in silicon greater than or equal to 0.1 MeV cm$^2$/mg.

12. The structure as in claim 10 wherein the said protons comprise a beam of protons with an effective linear energy transfer in silicon greater than zero but less than or equal to 1 MeV cm²/mg.

13. The structure as in claim 10 wherein the irradiation comprises a neutron environment with an energy distribution within the range of 0.1 MeV to 100 MeV.

14. The structure as in claim 1 further comprising at least one circuit made up of a plurality of active semiconductor devices.

15. The structure as in claim 14 wherein said circuit comprises at least one circuit selected from the group of analog to digital converter, digital to analog converter, voltage regulator, voltage reference, voltage monitor, operational amplifier, comparator, microprocessor, microcontroller, static random access memory, dynamic random access memory, RF transmitters, IF demodulators, system clock, sensor interface, or analog filter.

16. The structure as in claim 14 wherein said circuit is incorporated in a system selected from the group of satellite telemetry control, satellite attitude control, satellite sensors, satellite communications, satellite reaction wheel, or satellite antenna.

17. The structure as in claim 16 wherein said system is incorporated into at least one of the group of launch vehicle, orbiter, satellite, missile, and manned spacecraft.

18. The structure as in claim 1 wherein said first region is co-extensive with said second region.

19. The structure as in claim 1 wherein said first region is not co-extensive with said second region.

20. The structure of claim 1 further comprising at least one additional region having a thickness and a conductivity profile of the first conductivity type of said first region, and at least one additional interface region between said first region and said at least one additional region.

21. A method of forming a wafer structure comprising:
   forming a first region from a device wafer having at least one major surface, a thickness, and a conductivity profile of a first conductivity type substantially perpendicular to said at least one major surface;
   forming a second region from a separate handle wafer having a thickness, and a second conductivity profile of a second conductivity type opposite to that of said first region, such that said second region is in electrical contact with said first region opposite the major surface of said first region;
   forming a bond interface region between said first region and said second region; and
   placing impurity sites in said first region, such impurity sites being substantially electrically inactive over a temperature range,
   wherein the conductivity profile of said first region transitions abruptly to the conductivity profile of said second region within the interface region,
   wherein said first region, said second region, and said interface region comprise the same semiconductor material, and
   wherein said impurity sites are selected from the group of isotopes consisting of germanium, silicon, carbon, fluorine, sulfur, chlorine, nitrogen, or defects selected from the group consisting of lattice vacancies, interstitial defects, Frenkel defect pairs, crystal dislocations, or a combination of said isotopes and defects.

* * * * *